(12) United States Patent
Khlat et al.

(10) Patent No.: US 11,387,789 B2
(45) Date of Patent: Jul. 12, 2022

(54) CHARGE PUMP TRACKER CIRCUITRY

(71) Applicant: Qorvo US, Inc., Greensboro, NC (US)

(72) Inventors: Nadim Khlat, Cugnaux (FR); Michael R. Kay, Summerfield, NC (US); Michael J. Murphy, Statesville, NC (US)

(73) Assignee: QORVO US, INC., Greensboro, NC (US)

( * ) Notice: Subject to any disclaimer, the term of this patent is extended or adjusted under 35 U.S.C. 154(b) by 90 days.

(21) Appl. No.: 16/831,935

(22) Filed: Mar. 27, 2020

(65) Prior Publication Data

US 2020/0389132 A1 Dec. 10, 2020

Related U.S. Application Data

(60) Provisional application No. 62/857,493, filed on Jun. 5, 2019.

(51) Int. Cl.
*H03F 3/18* (2006.01)
*H03F 3/189* (2006.01)
*H02M 3/07* (2006.01)

(52) U.S. Cl.
CPC .............. *H03F 3/189* (2013.01); *H02M 3/07* (2013.01); *H03F 2200/102* (2013.01); *H03F 2200/105* (2013.01)

(58) Field of Classification Search
CPC ..................................................... H03F 3/189
See application file for complete search history.

(56) References Cited

U.S. PATENT DOCUMENTS

| 4,451,743 | A | 5/1984 | Suzuki et al. |
| 5,414,614 | A | 5/1995 | Fette et al. |
| 6,055,168 | A | 4/2000 | Kotowski et al. |

(Continued)

FOREIGN PATENT DOCUMENTS

WO 2009067591 A2 5/2009

OTHER PUBLICATIONS

Notice of Allowance for U.S. Appl. No. 16/662,699, dated Aug. 31, 2020, 7 pages.

(Continued)

*Primary Examiner* — Patricia T Nguyen
(74) *Attorney, Agent, or Firm* — Withrow & Terranova, P.L.L.C.

(57) ABSTRACT

Charge pump tracker circuitry is disclosed having a first switch network configured to couple a first flying capacitor between a voltage input terminal and a ground terminal during a first charging phase and couple the first flying capacitor between the voltage input terminal and a pump output terminal during a first discharging phase. A second switch network is configured to couple a second flying capacitor between the voltage input terminal and the ground terminal during a second charging phase and couple the second flying capacitor between the voltage input terminal and the pump output terminal during a second discharging phase. A switch controller is configured to monitor first and second voltages across the first and second flying capacitors, respectively, during the first and second discharging phases and in response to control the first and second switch networks so that the first the second discharging phases alternate in an interleaved mode.

20 Claims, 8 Drawing Sheets

(56) References Cited

U.S. PATENT DOCUMENTS

| | | | |
|---|---|---|---|
| 6,160,432 A | 12/2000 | Rhee et al. | |
| 6,169,673 B1 | 1/2001 | McIntyre et al. | |
| 6,188,274 B1 | 2/2001 | Vernon | |
| 6,819,197 B2 | 11/2004 | Maldonado | |
| 6,927,441 B2 | 8/2005 | Pappalardo et al. | |
| 6,937,487 B1 | 8/2005 | Bron | |
| 6,985,708 B2 | 1/2006 | Lin et al. | |
| 7,408,330 B2 | 8/2008 | Zhao | |
| 7,456,677 B1 | 11/2008 | Rao et al. | |
| 7,518,892 B2 | 4/2009 | Kitagawa et al. | |
| 7,531,996 B2 | 5/2009 | Yang et al. | |
| 7,622,900 B2 | 11/2009 | Komiya | |
| 7,705,560 B2 | 4/2010 | Johnson | |
| 7,714,546 B2 | 5/2010 | Kimura et al. | |
| 7,855,535 B2 | 12/2010 | Tiew et al. | |
| 7,884,665 B2 | 2/2011 | Saikusa et al. | |
| 7,907,430 B2 | 3/2011 | Kularatna et al. | |
| 7,952,424 B2 | 5/2011 | Sanduleanu et al. | |
| 7,990,742 B2 | 8/2011 | Lesso | |
| 7,994,864 B2 | 8/2011 | Chen et al. | |
| 8,000,117 B2 | 8/2011 | Petricek | |
| 8,044,706 B2 | 10/2011 | Saman et al. | |
| 8,089,788 B2 | 1/2012 | Jain | |
| 8,223,514 B2 | 7/2012 | Kajino | |
| 8,259,476 B2 | 9/2012 | Ben-Yaakov et al. | |
| 8,427,205 B1 | 4/2013 | Nagaraj et al. | |
| 8,564,985 B2 | 10/2013 | van Straaten | |
| 8,619,445 B1* | 12/2013 | Low | H02M 1/32 363/59 |
| 8,710,911 B2 | 4/2014 | Chien | |
| 8,854,019 B1 | 10/2014 | Levesque et al. | |
| 9,069,365 B2 | 6/2015 | Brown et al. | |
| 9,256,234 B2 | 2/2016 | Kay et al. | |
| 9,280,163 B2 | 3/2016 | Kay et al. | |
| 9,362,818 B2 | 6/2016 | Gorisse et al. | |
| 9,374,005 B2 | 6/2016 | Rozek et al. | |
| 9,484,809 B2 | 11/2016 | Floyd | |
| 9,553,567 B2 | 1/2017 | Kadam | |
| 9,653,944 B2 | 5/2017 | Teggatz et al. | |
| 9,729,048 B2 | 8/2017 | Crandall et al. | |
| 9,866,178 B2 | 1/2018 | Anderson | |
| 10,090,809 B1 | 10/2018 | Khlat | |
| 10,177,602 B2 | 1/2019 | Akram et al. | |
| 10,277,072 B2 | 4/2019 | Yen et al. | |
| 10,404,086 B2 | 9/2019 | Wu et al. | |
| 10,404,175 B2 | 9/2019 | Chakraborty et al. | |
| 10,439,624 B2 | 10/2019 | Schober et al. | |
| 10,615,687 B1 | 4/2020 | Khlat | |
| 10,680,524 B2 | 6/2020 | Chen et al. | |
| 10,707,840 B2 | 7/2020 | Bodano et al. | |
| 10,879,796 B2 | 12/2020 | Khlat | |
| 2004/0167407 A1 | 8/2004 | Roberts | |
| 2008/0157732 A1 | 7/2008 | Williams | |
| 2009/0059630 A1 | 3/2009 | Williams | |
| 2010/0259303 A1* | 10/2010 | Liao | G05F 1/56 327/108 |
| 2011/0101938 A1 | 5/2011 | Ma et al. | |
| 2011/0227633 A1 | 9/2011 | Mo et al. | |
| 2012/0001685 A1* | 1/2012 | Levine | G01N 33/00 327/536 |
| 2012/0062205 A1 | 3/2012 | Levesque et al. | |
| 2012/0170334 A1 | 7/2012 | Menegoli et al. | |
| 2015/0372592 A1 | 12/2015 | Floyd | |
| 2017/0255250 A1 | 9/2017 | Ngo et al. | |
| 2017/0257024 A1* | 9/2017 | Wu | H02J 7/345 |
| 2019/0115829 A1 | 4/2019 | Oporta et al. | |
| 2019/0190284 A1 | 6/2019 | Pinto et al. | |
| 2019/0207505 A1 | 7/2019 | Ramadass et al. | |
| 2019/0280590 A1 | 9/2019 | Lee et al. | |
| 2019/0356285 A1 | 11/2019 | Khlat et al. | |
| 2019/0386481 A1 | 12/2019 | Cho et al. | |
| 2020/0014294 A1 | 1/2020 | Song et al. | |
| 2020/0144913 A1 | 5/2020 | Harjani et al. | |

OTHER PUBLICATIONS

Non-Final Office Action for U.S. Appl. No. 16/237,141, dated Apr. 3, 2020, 14 pages.
Non-Final Office Action for U.S. Appl. No. 16/662,699, dated May 1, 2020, 7 pages.
Non-Final Office Action for U.S. Appl. No. 12/567,318, dated May 29, 2012, 7 pages.
Final Office Action for U.S. Appl. No. 12/567,318, dated Oct. 22, 2012, 7 pages.
Non-Final Office Action for U.S. Appl. No. 12/567,318, dated Apr. 2, 2013, 5 pages.
Final Office Action for U.S. Appl. No. 12/567,318, dated Jul. 19, 2013, 7 pages.
Advisory Action for U.S. Appl. No. 12/567,318, dated Aug. 27, 2013, 3 pages.
Non-Final Office Action for U.S. Appl. No. 12/567,318, dated Oct. 24, 2013, 6 pages.
Notice of Allowance for U.S. Appl. No. 12/567,318, dated Feb. 18, 2014, 8 pages.
Non-Final Office Action for U.S. Appl. No. 13/013,986 dated Jun. 28, 2012, 13 pages.
Final Office Action for U.S. Appl. No. 13/013,986 dated Oct. 19, 2012, 16 pages.
Advisory Action for U.S. Appl. No. 13/013,986 dated Jan. 9, 2013, 6 pages.
Examiner's Answer to U.S. Appl. No. 13/013,986, dated Jun. 28, 2013, 26 pages.
Decision on Appeal for U.S. Appl. No. 13/013,986, mailed Nov. 18, 2015, 7 pages.
Notice of Allowance for U.S. Appl. No. 13/013,986, dated Feb. 12, 2016, 9 pages.
Notice of Allowance for U.S. Appl. No. 16/448,762, dated Nov. 27, 2019, 9 pages.
Notice of Allowance for U.S. Appl. No. 16/787,706, dated Aug. 19, 2020, 10 pages.

* cited by examiner

TABLE 1

| INTERLEAVE ENABLE | PARALLEL ENABLE | BOOST1 COMPARATOR | BOOST2 COMPARATOR | BOOST ENABLE | BOOST1 | BOOST2 |
|---|---|---|---|---|---|---|
| 0 | 0 | 0 | X | 1 | 0 | 0 |
| 0 | 0 | 1 | X | 1 | 1 | 0 |
| 0 | 1 | 0 | X | 1 | 0 | 0 |
| 0 | 1 | 1 | X | 1 | 1 | 1 |
| 1 | X | 0 | 0 | 1 | 0 | 0 |
| 1 | X | 0 | 1 | 1 | 0 | 1 |
| 1 | X | 1 | 0 | 1 | 1 | 0 |
| 1* | X | 1* | 1* | 1* | 1* | 0* |
| X | X | X | X | 0 | 0 | 0 |

FIG. 7

CHARGE PUMP TRACKER CIRCUITRY

RELATED APPLICATIONS

This application claims the benefit of provisional patent application Ser. No. 62/857,493, filed Jun. 5, 2019, the disclosure of which is hereby incorporated herein by reference in its entirety.

FIELD OF THE DISCLOSURE

The embodiments disclosed herein relate to power management systems for supplying power to radio frequency amplifiers.

BACKGROUND

Fifth-generation New Radio (5G-NR) wireless communication systems have been widely regarded as the next wireless communication standard beyond the current third-generation (3G) communication standard, such as wideband code division multiple access (WCDMA), and fourth-generation (4G) communication standard, such as Long-Term Evolution (LTE). The 5G-NR wireless communication system is expected to provide a significantly higher data rate, improved coverage range, enhanced signaling efficiency, and reduced latency compared with wireless communication systems based on the 3G and 4G communication standards.

In this regard, 5G-NR transmitting wireless devices need to power radio frequency amplifiers in an average power tracking mode when operating with a relatively large modulation bandwidth of 100 MHz or above within a power class 2 requirement. Alternatively, it is desirable for 5G-NR transmitting wireless devices to power radio frequency amplifiers in an envelope tracking mode for lower modulation bandwidths. As such, there is a need for charge pump tracker circuitry that is reconfigurable both to deliver relatively higher voltages and currents demanded by the average power tracking and to provide more efficient delivery of power in the envelope tracking mode.

SUMMARY

Charge pump tracker circuitry is disclosed having a first switch network configured to couple a first flying capacitor between a voltage input terminal and a ground terminal during a first charging phase and couple the first flying capacitor between the voltage input terminal and a pump output terminal during a first discharging phase. A second switch network is configured to couple a second flying capacitor between the voltage input terminal and the ground terminal during a second charging phase and couple the second flying capacitor between the voltage input terminal and the pump output terminal during a second discharging phase. A switch controller is configured to monitor a first voltage across the first flying capacitor during the first discharging phase and to monitor a second voltage across the second flying capacitor during the second discharging phase and in response to control the first switch network and the second switch network so that the first and the second discharging phases alternate in an interleaved mode, and so that the first discharging phase and the second discharging phase are in phase during a parallel boost mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 7 is a logic table depicting various logic states for the boost logic circuitry depicted in FIG. 6.

DETAILED DESCRIPTION

Figure 1:
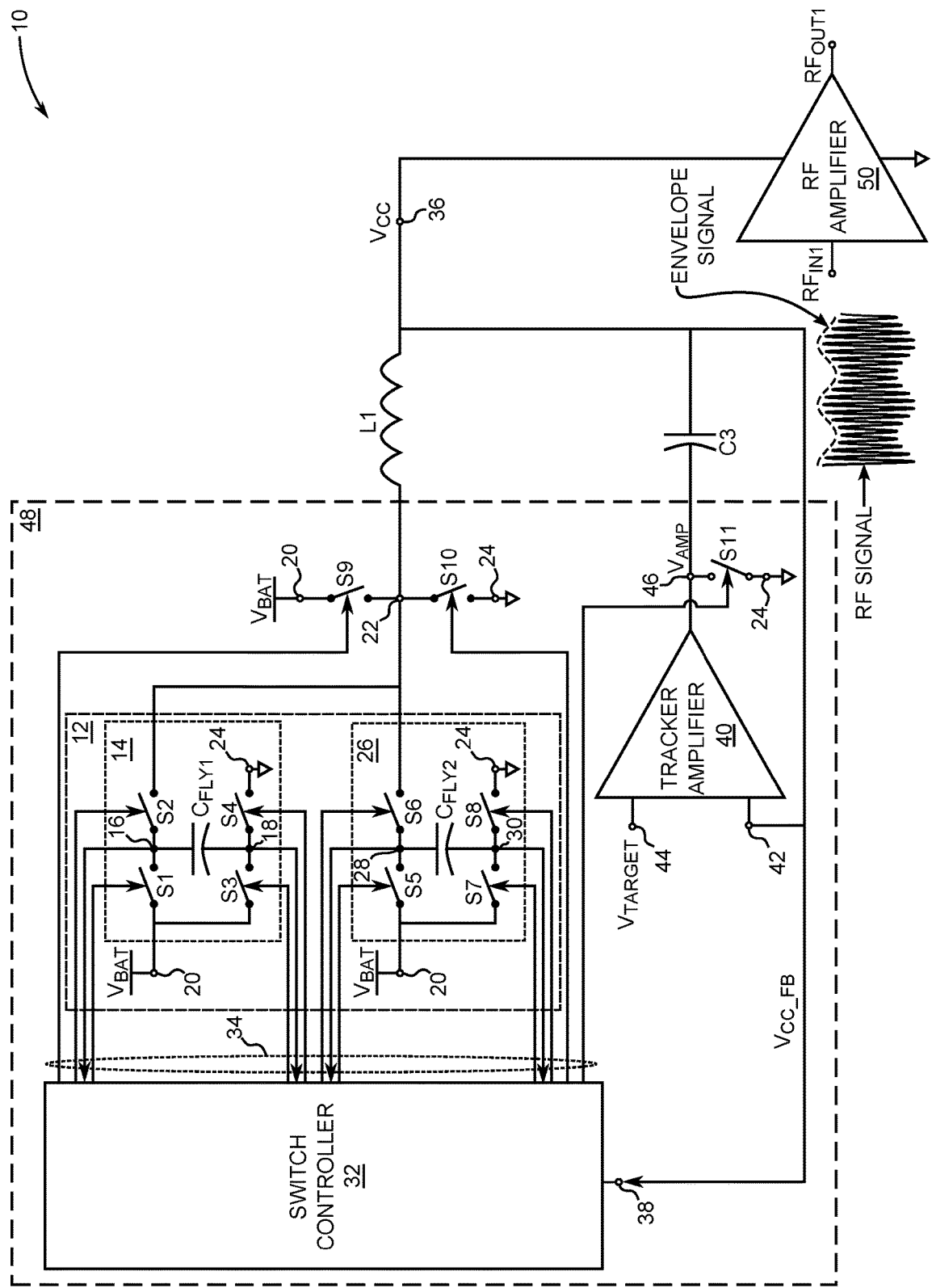
FIG. 1 is a schematic of charge pump tracker circuitry that is reconfigurable in accordance with the present disclosure to provide an interleaved mode for average power tracking operation and a parallel mode for envelope tracking operation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, a digital signal's logic state is defined as being a true logic state when the digital signal's logic state results in enabling an operation or a switch closure. In contrast, a digital signal's logic state is defined as being a false logic state when the digital signal's logic state results in disabling an operation and opening a switch. In the examples of the present disclosure, a logic true state is represented by a higher voltage level and a logic false state is represented by a lower voltage level.

FIG. 1 is a schematic of an exemplary embodiment of charge pump tracker circuitry 10 that is reconfigurable in accordance with the present disclosure to provide an interleaved mode for average power tracking (APT) operation and a parallel mode for envelope tracking (ET) operation. The charge pump tracker circuitry 10 includes a dual-boost charge pump 12 having a first switch network 14 that includes a first flying capacitor $C_{FLY1}$ that is coupled between a first flying node 16 and a second flying node 18. A first switch S1 is coupled between a voltage source terminal 20 and the first flying node 16. A second switch S2 is coupled between a pump output terminal 22 and the first flying node 16. A third switch S3 is coupled between the second flying node 18 and the voltage source terminal 20, and a fourth switch S4 is coupled between a fixed voltage terminal 24 and the second flying node 18. A voltage source battery $V_{BAT}$ is typically coupled to the voltage source terminal 20, and the fixed voltage terminal 24 is typically coupled to ground.

The dual-boost charge pump 12 further includes a second switch network 26 that includes a second flying capacitor $C_{FLY2}$ that is coupled between a third flying node 28 and a fourth flying node 30. A fifth switch S5 is coupled between the voltage source terminal 20 and the third flying node 28. A sixth switch S6 is coupled between the pump output terminal 22 and the third flying node 28. A seventh switch S7 is coupled between the fourth flying node 30 and the voltage source terminal 20, and an eighth switch S8 is coupled between the fixed voltage terminal 24 and the fourth flying node 30.

The charge pump tracker circuitry 10 further includes a switch controller 32 configured to control the opening and closing of the first through fourth switches S1-S4 of the first switch network 14 and fifth through eighth switches S5-S8 of the second switch network 26. In particular, the switch controller 32 has a control bus 34 communicatively coupled to control terminals of the first through eighth switches S1-S8. Lines having arrows touching the first through eighth switches S1-S8 symbolically represent switch control lines. In contrast, lines having arrows touching the switch controller 32 symbolically represent inputs of differential voltage measurements of voltages across the first flying capacitor $C_{FLY1}$ and the second flying capacitor $C_{FLY2}$. In some embodiments, the first through eighth switches S1-S8 are field-effect transistors, wherein the control terminals are field-effect transistor gate terminals coupled to the control bus 34 of the switch controller 32. In other embodiments, the first through eighth switches S1-S8 are microelectromechanical system switches, wherein the control terminals are microelectromechanical system gate terminals coupled to the control bus 34.

To charge the first flying capacitor $C_{FLY1}$, the switch controller 32 initiates a first charging phase by commanding the first switch S1 and the fourth switch S4 to close and the third switch S3 and the second switch S2 to open so that a first charging current flows into the first flying capacitor $C_{FLY1}$. The switch controller 32 then commands the first switch S1 and the fourth switch S4 to open and the second switch S2 and the third switch S3 to close to initiate a first discharging phase to allow a first discharging current to flow from the first flying capacitor $C_{FLY1}$ and through the pump output terminal 22.

To charge the second flying capacitor $C_{FLY2}$, the switch controller 32 initiates a second charging phase by commanding the fifth switch S5 and the eighth switch S8 to close and the seventh switch S7 and the sixth switch S6 to open so that a second charging current flows into the second flying capacitor $C_{FLY2}$. The switch controller 32 then commands the fifth switch S5 and the eighth switch S8 to open and the sixth switch S6 and the seventh switch S7 to close to initiate a second discharging phase to allow a second discharging current to flow from the second flying capacitor $C_{FLY2}$ and through the pump output terminal 22.

The switch controller 32 is further configured to provide a parallel mode of operation by controlling the first switch network 14 made up of the first through fourth switches S1-S4 and the second switch network 26 made up of the fifth through eighth switches S5-S8 so that the first discharging phase and the second discharging phase are in unison. As such, the parallel mode provides a summation of the first discharging current and the second discharging current at the pump output terminal 22, which yields a higher efficiency for ET.

The switch controller 32 is yet further configured to provide an interleaved mode of operation by controlling the first switch network 14 made up of the first through fourth switches S1-S4 and the second switch network 26 made up of the fifth through eighth switches S5-S8 such that the first discharging phase and the second discharging phase alternates so that the first discharging current and the second discharging currents do not sum at the pump output terminal 22 but instead flow through the pump output terminal 22 sequentially. As such, the interleaved mode provides higher continuous power and is favored for APT.

The charge pump tracker circuitry 10 further includes a power inductor L1 coupled between the pump output terminal 22 and an RF amplifier supply terminal 36 through which a modulated output supply voltage $V_{CC}$ is provided. The power inductor L1 provides filtering of power generated by the dual-boost charge pump 12. In particular, the power inductor is configured to filter power flowing between the pump output terminal 22 and the RF amplifier supply terminal 36.

A ninth switch S9 is coupled between the voltage source terminal 20 and the pump output terminal 22, and a tenth switch S10 is coupled between the pump output terminal 22 and the fixed voltage terminal 24. In exemplary embodiments, the fixed voltage terminal 24 is coupled to ground. Control terminals of the ninth switch S9 and the tenth switch S10 are coupled to the control bus 34 of the switch controller 32, which in some embodiments is configured to momentarily selectively close the ninth switch S9 and the tenth switch S10 in an alternating sequence to maintain current flow through the power inductor L1 when the second switch S2 and the sixth switch S6 are open.

A feedback input terminal 38 is coupled to the RF amplifier supply terminal 36 to convey a feedback signal $V_{CC\_FB}$ to the switch controller 32, which in some embodiments is further configured to automatically switch between the parallel mode and the interleaved mode based upon a predetermined feedback signal set point.

The charge pump tracker circuitry 10 further includes a tracker amplifier 40 that has a first amplifier input terminal 42 coupled to the RF amplifier supply terminal 36 to receive the feedback signal $V_{CC\_FB}$. The tracker amplifier 40 further includes a target voltage input terminal 44 for receiving a target voltage waveform $V_{TARGET}$, and an amplifier output terminal 46 through which an amplified voltage waveform $V_{AMP}$ that is a scaled difference between the feedback signal $V_{CC\_FB}$ and the target voltage waveform $V_{TARGET}$ is provided. The amplifier output terminal 46 is coupled to the RF amplifier supply terminal 36 through a third capacitor C3 that provides an offset voltage to increase dynamic range of the amplified voltage waveform $V_{AMP}$ in order to reduce the maximum voltage needed to supply the tracker amplifier 40 and thereby further increase efficiency.

An eleventh switch S11 is coupled between the amplifier output terminal 46 and the fixed voltage terminal 24, which in this exemplary embodiment is coupled to ground. A control terminal of the eleventh switch S11 is coupled to the control bus 34. The switch controller 32 is configured to close the eleventh switch S11 when the tracker amplifier 40 is disabled and open the eleventh switch S11 when the tracker amplifier 40 is enabled. The tracker amplifier 40 typically is enabled during a higher power demand operation such as APT and disabled during a lower power demand operation such as ET.

The dual-boost charge pump 12, the switch controller 32, and the tracker amplifier 40 may be integrated into an envelope tracking power management integrated circuit (ETIC) 48 that is configured to provide the modulated output supply voltage $V_{CC}$ to a radio frequency (RF) amplifier 50, which receives an RF signal at an RF signal input terminal $RF_{IN1}$. The RF amplifier 50 provides an amplified version of the RF signal at an RF signal output terminal $RF_{OUT1}$. When the ETIC 48 is operating in an envelope tracking mode, the modulated output supply voltage $V_{CC}$ follows an envelope signal such as depicted in long-dashed line in FIG. 1.

Figure 2:
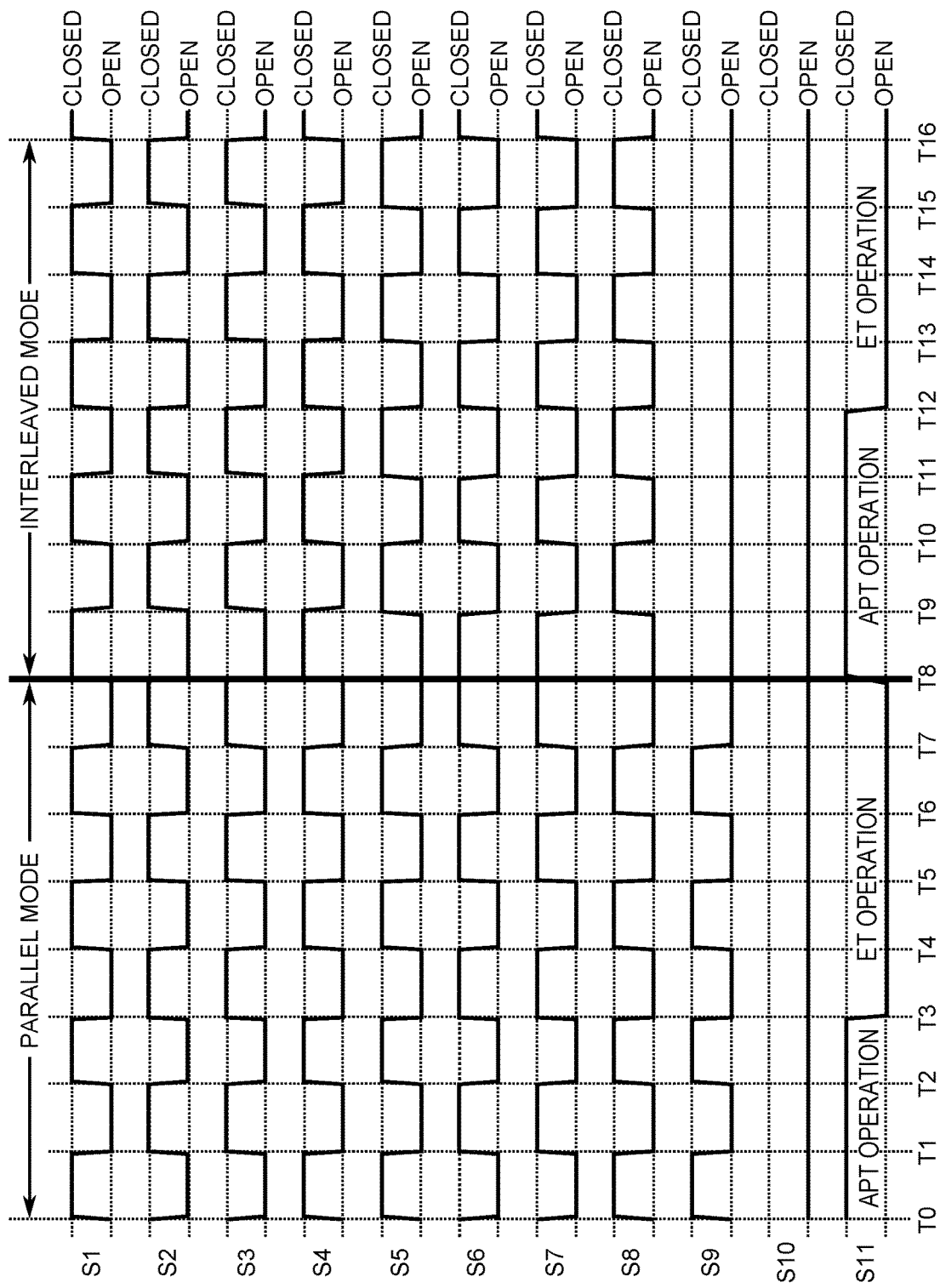
FIG. 2 is an exemplary timing diagram for open and closed states of switches of the charge pump tracker circuitry operated in both the parallel mode and the interleaved mode.

FIG. 2 is an exemplary timing diagram for open and closed states of the first through eleventh switches S1-S11 in both the parallel mode and the interleaved mode. While the exemplary timing diagram depicts a 50% duty cycle in the parallel mode and a 100% duty cycle in the interleaved mode, other embodiments can be operated that have different duty cycles. Time periods T0 through T8 depict open and closed states of the first through eighth switches S1-S8 needed for the parallel mode, while time periods T8 through T16 depict open and closed states of the first through eighth switches S1-S8 needed for the interleaved mode. Referring to both the schematic of the exemplary embodiment of charge pump tracker circuitry 10 in FIG. 1 and the timing diagram of FIG. 2, notice that the switch controller 32 closes both the second switch S2 and the sixth switch S6 in unison while operating in the parallel mode. In contrast, notice that the switch controller 32 opens the second switch S2 while closing the sixth switch S6 and closes the second switch S2 while opening the sixth switch S6 in the interleaved mode. In the parallel mode, the ninth switch S9 matches the openings and closures of the first switch S1, the fourth switch S4, the fifth switch S5, and the eighth switch S8. Moreover, in parallel mode, the tenth switch S10 is open while boosting the voltage source battery $V_{BAT}$. In some embodiments, while bucking the voltage source battery $V_{BAT}$, the tenth switch is closed. Further still, in the parallel mode, the eleventh switch S11 is closed for APT operation and open during ET operation.

In the interleaved mode, the ninth switch S9 remains open during 100% duty cycle operation as depicted in the exemplary timing diagram of FIG. 2. However, in other embodiments operating at other than 100% duty cycle, the ninth switch S9 is open when either the second switch S2 or the sixth switch S6 is closed. The tenth switch S10 is open while boosting the voltage source battery $V_{BAT}$. In some embodiments, while bucking the voltage source battery $V_{BAT}$, the tenth switch is closed. The eleventh switch S11 is closed during APT operation in the interleaved mode. However, as depicted in FIG. 2, during ET operation in interleaved mode the eleventh switch S11 is left open to allow the tracker amplifier 40 to follow the envelope signal (FIG. 1).

The dual-boost charge pump 12 of FIG. 1 is considered to be in a high-impedance state, also referred to as a HiZ state, when all of the switches, the first switch S1 through the eighth switch S8 are simultaneously open. In some embodiments, while bucking the voltage source battery $V_{BAT}$, the ninth switch S9 and the tenth switch S10 are alternately opened and closed to toggle coupling of the pump output terminal 22 between the voltage source battery $V_{BAT}$ and ground. Moreover, during a boosting operation while operating in the parallel mode, the pump output node alternates between a voltage equal to $V_{BAT}$ and twice $V_{BAT}$. Further still, during a boosting operation and while operating in the interleaved mode, voltage at the pump output terminal 22 alternates between a voltage equal to $V_{BAT}$ and twice $V_{BAT}$ during a first phase and a second phase. Note, that when boosting in the interleaved mode at 100% duty cycle, the pump output terminal 22 is not toggled to $V_{BAT}$. Instead, the first phase and the second phase in the interleaved mode at 100% duty cycle spend time at twice $V_{BAT}$ voltage but never at $V_{BAT}$ voltage.

Figure 3:
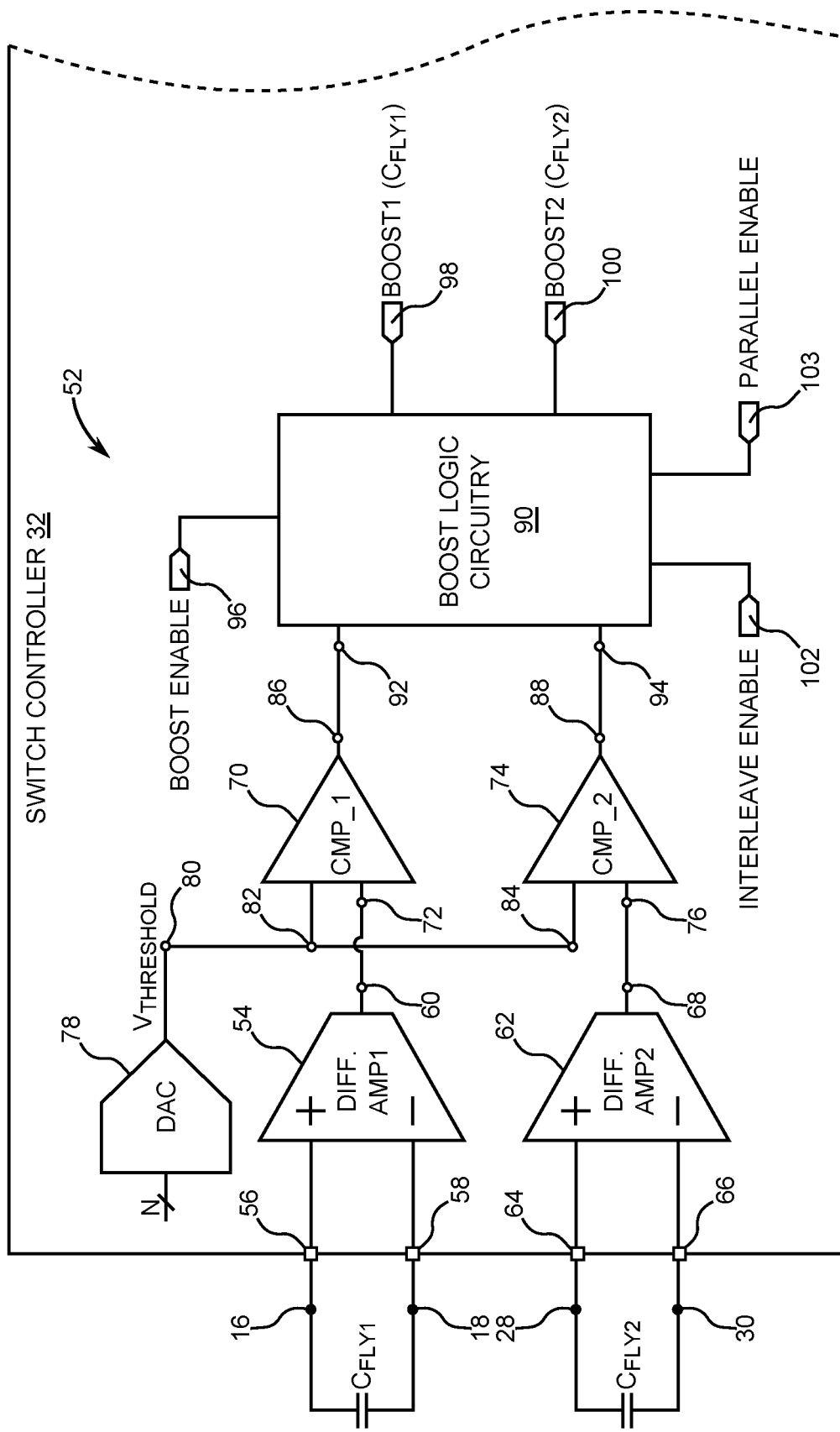
FIG. 3 is a schematic diagram of an exemplary sub-controller that is integrated within the switch controller.

FIG. 3 is a schematic diagram of an exemplary sub-controller 52 that is integrated within the switch controller 32. The sub-controller 52 includes a first differential amplifier 54 having a first positive input terminal 56 coupled to the first flying node 16 and a first negative input terminal 58 coupled to the second flying node 18. These couplings provide for monitoring of the voltage across the first flying capacitor $C_{FLY1}$. The first differential amplifier 54 has a first voltage monitor output terminal 60.

The sub-controller 52 also includes a second differential amplifier 62 having a second positive terminal 64 coupled to the third flying node 28 and a second negative input terminal 66 coupled to the fourth flying node 30. These couplings provide for monitoring of the voltage across the second flying capacitor $C_{FLY2}$. The second differential amplifier 62 has a second voltage monitor output terminal 68.

Further included is a first comparator 70 having a first comparator input terminal 72 coupled to the first voltage monitor output terminal 60. A second comparator 74 has a second comparator input terminal 76 coupled to the second voltage monitor output terminal 68.

A threshold voltage generator 78 has a threshold output terminal 80 coupled to both a third comparator input terminal 82 of the first comparator 70 and a fourth comparator input terminal 84 of the second comparator 74. The first comparator 70 is configured to provide a first logic level output signal at a first comparator output terminal 86 in response to a comparison of an output voltage of the first differential amplifier 54 to a threshold voltage $V_{THRESHOLD}$. Further still, the second comparator 74 is configured to provide a second logic level output signal at a second comparator output terminal 88 in response to a comparison of an output voltage of the second differential amplifier 62 to the threshold voltage $V_{THRESHOLD}$. In the exemplary embodiment depicted in FIG. 3, the threshold voltage generator 78 is a digital-to-analog converter (DAC). The DAC embodiment of the threshold voltage generator 78 is configured to receive an N-bit digital value from a baseband controller (not shown) and convert the N-bit digital value into the threshold voltage $V_{THRESHOLD}$. However, in other embodiments the threshold voltage generator 78 may be a series string of fixed resistors coupled between a voltage source such as $V_{BAT}$ and ground, or the threshold voltage generator 78 may by a string of field-effect transistors configured to provide variable resistances. In these other embodiments, the threshold output terminal 80 is a tap between an adjacent pair of the fixed resistors or field-effect transistors. In exemplary embodiments, the threshold voltage $V_{THRESHOLD}$ may be set within a range of 70% $V_{BAT}$ to 50% $V_{BAT}$. In other exemplary embodiments, the threshold voltage may be set within a range of 50% $V_{BAT}$ to 25% $V_{BAT}$.

Boost logic circuitry 90 includes a first logic input terminal 92 that is coupled to the first comparator output terminal 86. A second logic input terminal 94 is coupled to the second comparator output terminal 88. The boost logic circuitry 90 also includes a third logic input terminal 96 that is configured to receive a boost enable signal that enables the boost logic circuitry 90 to generate at a first logic output terminal 98 a BOOST1 signal associated with charging the first flying capacitor $C_{FLY1}$ and to generate at a second logic output terminal 100 a BOOST2 signal associated with the second flying capacitor $C_{FLY2}$. A fourth logic input terminal 102 is configured to receive an INTERLEAVE ENABLE signal that enables the interleaved mode that ensures that the BOOST1 and the BOOST2 signals are generated out of phase with one another whenever the INTERLEAVE ENABLE signal is true. The boost logic circuitry 90 is further configured to ensure that the BOOST1 and the BOOST2 signals are generated in phase for the parallel boost mode whenever the INTERLEAVE ENABLE signal is false. Moreover, a fifth logic input terminal 103 is configured to receive a PARALLEL ENABLE signal that enables the parallel mode to ensure that the BOOST1 and the BOOST2 signals are generated in phase when the PARALLEL ENABLE signal is true.

Figure 4:
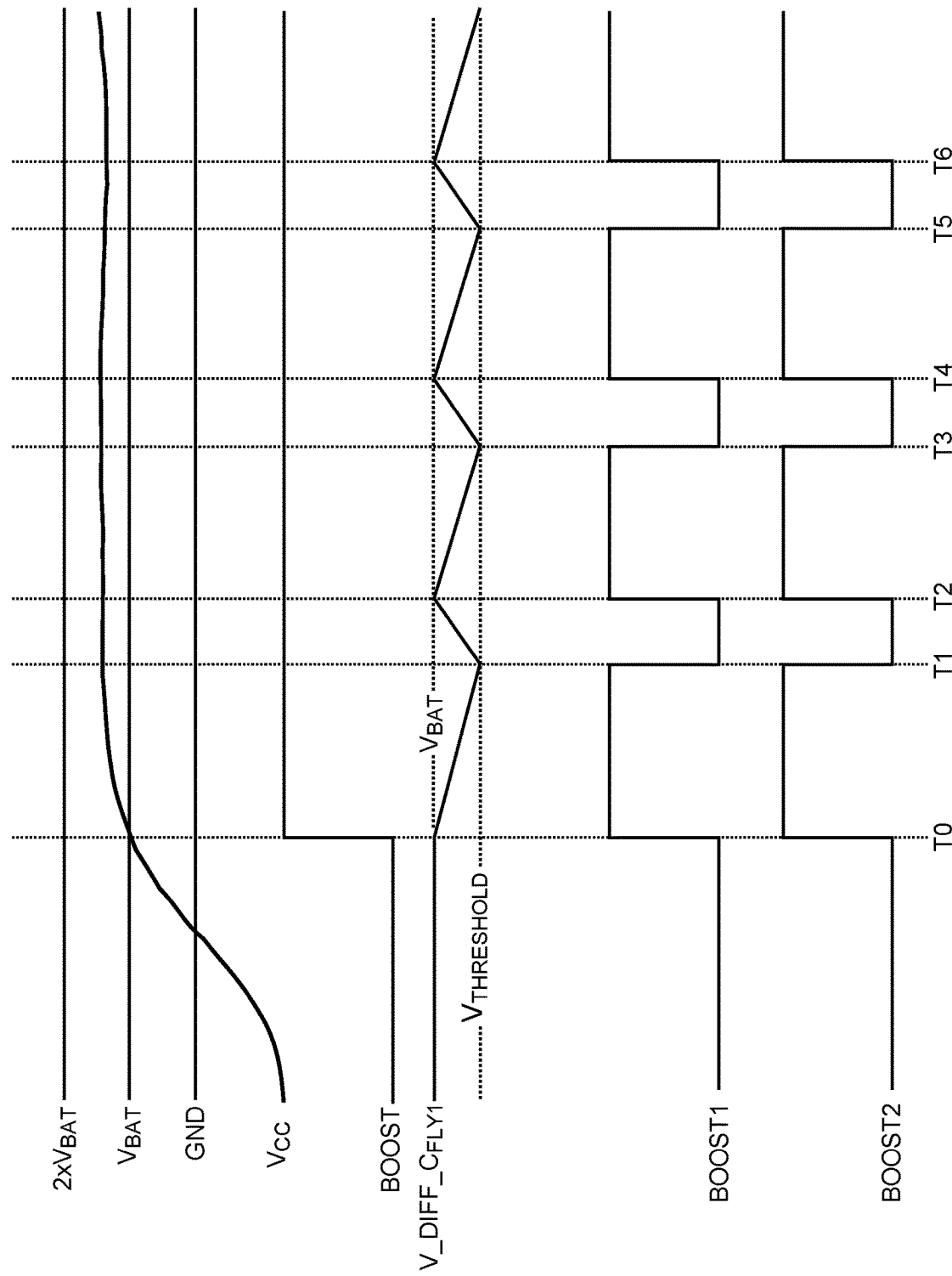
FIG. 4 is a graph of signals related to the operation of the charge pump tracker circuitry depicted in FIG. 1 and the sub-controller depicted during a parallel boost mode.

FIG. 4 is a graph of signals related to the operation of the charge pump tracker circuitry 10 (FIG. 1) and the boost logic circuitry 90 (FIG. 3) during the parallel boost mode when the INTERLEAVE ENABLE signal (FIG. 3) is in the false logic state. At a time T0, a demand for the modulated output supply voltage $V_{CC}$ exceeds the source voltage battery $V_{BAT}$. Thus, at time T0, the BOOST signal applied to the third logic input terminal 96 transitions from false to true, which in this exemplary case transitions from low to high. In response to the BOOST signal, the boost logic circuitry 90 (FIG. 3) monitors a logic level of the first logic input terminal 92 to determine the state of discharge of the first flying capacitor $C_{FLY1}$ sensed by the first differential amplifier 54. The first comparator 70 sets the logic level of the first logic input terminal 92 based upon a comparison of the threshold voltage $V_{THRESHOLD}$ and the voltage of the first flying capacitor $C_{FLY1}$ represented by a differential voltage labeled V_DIFF_$C_{FLY1}$ in FIG. 4. As long as the discharging voltage across the first flying capacitor $C_{FLY1}$ remains above the threshold voltage $V_{THRESHOLD}$, the boost logic circuitry 90 maintains the BOOST1 and the BOOST2 signals in a true logic state, which in this exemplary case is logic high. The switch controller 32 responds to the BOOST1 and the BOOST2 signals being in the true logic state by coupling the first flying capacitor $C_{FLY1}$ and the second flying capacitor $C_{FLY2}$ between the voltage source terminal 20 (FIG. 1) and a pump output terminal 22 during the discharging phase. At time T1, the voltage across the first flying capacitor $C_{FLY1}$ discharges below the voltage threshold $V_{THRESHOLD}$ and in response the boost logic circuitry 90 transitions the BOOST1 signal and the BOOST2 signal to a false logic state, which in this exemplary case is logic low. The switch controller 32 responds to the BOOST1 and the BOOST2 signals being in the false logic state by coupling the first flying capacitor $C_{FLY1}$ and the second flying capacitor $C_{FLY2}$ between the voltage source terminal 20 and the fixed voltage terminal 24 during the charging phase. The charging phase continues until a time T2 when the voltage across the first flying capacitor $C_{FLY1}$ and the second flying capacitor $C_{FLY2}$ substantially charges to $V_{BAT}$. Times T2 through T6 depict two additional cycles of the BOOST1 signal and BOOST2 signals in-phase during the parallel boost mode. Additional cycles repeat a similar pattern until either the boost signal transitions to the false logic state or the INTERLEAVE ENABLE signal (FIG. 3) transitions to the true logic state.

While this exemplary embodiment is configured to monitor the voltage of the first flying capacitor $C_{FLY1}$, it is to be understood that because the first flying capacitor $C_{FLY1}$ and the second flying capacitor $C_{FLY2}$ are coupled in parallel during the parallel mode, the voltages across the first flying capacitor $C_{FLY1}$ and the second flying capacitor $C_{FLY2}$ are equal. Therefore, monitoring the voltage across either the first flying capacitor $C_{FLY1}$ or the second flying capacitor $C_{FLY2}$ is usable by the boost logic circuitry 90 to generate the BOOST1 signal and the BOOST2 signal, which in the parallel mode are in-phase.

Figure 5:
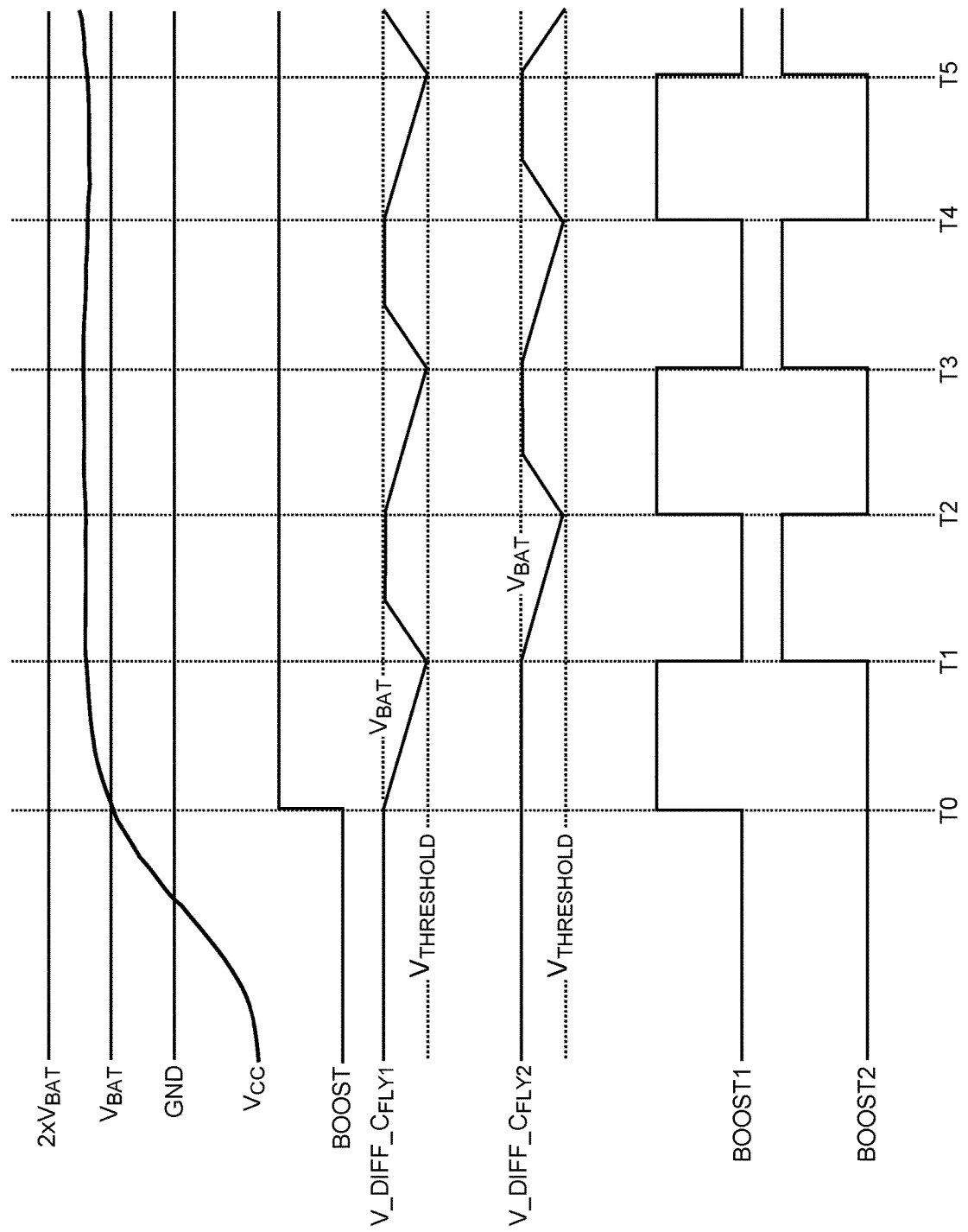
FIG. 5 is a graph of signals related to the operation of the charge pump tracker circuitry depicted in FIG. 1 and the sub-controller depicted in FIG. 3 while boosting output supply voltage in an interleaved mode.

FIG. 5 is a graph of signals related to the operation of the charge pump tracker circuitry 10 (FIG. 1) and the boost logic circuitry 90 (FIG. 3) during the interleaved mode when the INTERLEAVE ENABLE signal is in the true logic state. At a time T0, a demand for the modulated output supply voltage $V_{CC}$ exceeds the source voltage battery $V_{BAT}$. Thus, at time T0, the BOOST signal applied to the third logic input terminal 96 transitions from false to true, which in this exemplary case transitions from low to high. In response to the BOOST signal, the boost logic circuitry 90 (FIG. 3) monitors a logic level of the first logic input terminal 92 to determine the state of discharge of the first flying capacitor $C_{FLY1}$ sensed by the first differential amplifier 54. The first comparator 70 sets the logic level of the first logic input terminal 92 based upon a comparison of the threshold voltage $V_{THRESHOLD}$ and the voltage of the first flying capacitor $C_{FLY1}$ represented by a first differential voltage labeled V_DIFF_$C_{FLY1}$ in FIG. 4.

As long as the discharging voltage across the first flying capacitor $C_{FLY1}$ remains above the threshold voltage $V_{THRESHOLD}$, the boost logic circuitry 90 maintains the BOOST1 in the true logic state and the BOOST2 signals in the false logic state. The switch controller 32 responds to the BOOST1 being in the true logic state by coupling the first flying capacitor $C_{FLY1}$ between the voltage source terminal 20 (FIG. 1) and the pump output terminal 22 to place the first flying capacitor $C_{FLY1}$ into the discharging phase. In contrast, the switch controller 32 responds to the BOOST2 signal being in the false logic state by placing the second flying capacitor $C_{FLY2}$ into the charging phase by coupling the second flying capacitor $C_{FLY2}$ between the voltage source terminal 20 (FIG. 1) and the fixed voltage terminal 24. The first flying capacitor $C_{FLY1}$ continues to discharge until at a time T1 the first differential voltage V_DIFF_$C_{FLY1}$ across the first flying capacitor $C_{FLY1}$ discharges below the voltage threshold $V_{THRESHOLD}$, and in response the boost logic circuitry 90 transitions the BOOST1 signal from a true logic state to a false logic state. Practically simultaneously, the BOOST2 signal transitions from a false logic state to a true logic state. In response to the transition of the BOOST2 signal, the switch controller 32 couples the second flying capacitor $C_{FLY2}$ between the voltage source terminal 20 and the pump output terminal 22 to place the second flying capacitor $C_{FLY2}$ into the discharging phase that discharges a second differential voltage labeled V_DIFF_$C_{FLY2}$ in FIG. 4.

In contrast, and practically simultaneously, the switch controller 32 responds to the BOOST1 signal being in the false logic state by placing the first flying capacitor $C_{FLY1}$ into the charging phase by coupling the first flying capacitor $C_{FLY1}$ between the voltage source terminal 20 (FIG. 1) and the fixed voltage terminal 24 to recharge the first differential voltage V_DIFF_$C_{FLY1}$ to substantially the $V_{BAT}$ voltage. Times T2 through T6 depict one and one-half additional cycles of the BOOST1 signal and BOOST2 signals that are out-of-phase with each other during the interleaved mode. Additional cycles repeat a similar pattern until either the boost signal transitions to the false logic state or the INTERLEAVE ENABLE signal (FIG. 3) transitions to the false logic state. In some embodiments, frequency of the BOOST1 signal and the BOOST2 signal is between 500 kHz to 10 MHz. In yet other embodiments, frequency of the BOOST1 signal and the BOOST2 signal is between 10 MHz to 20 MHz.

Figure 6:
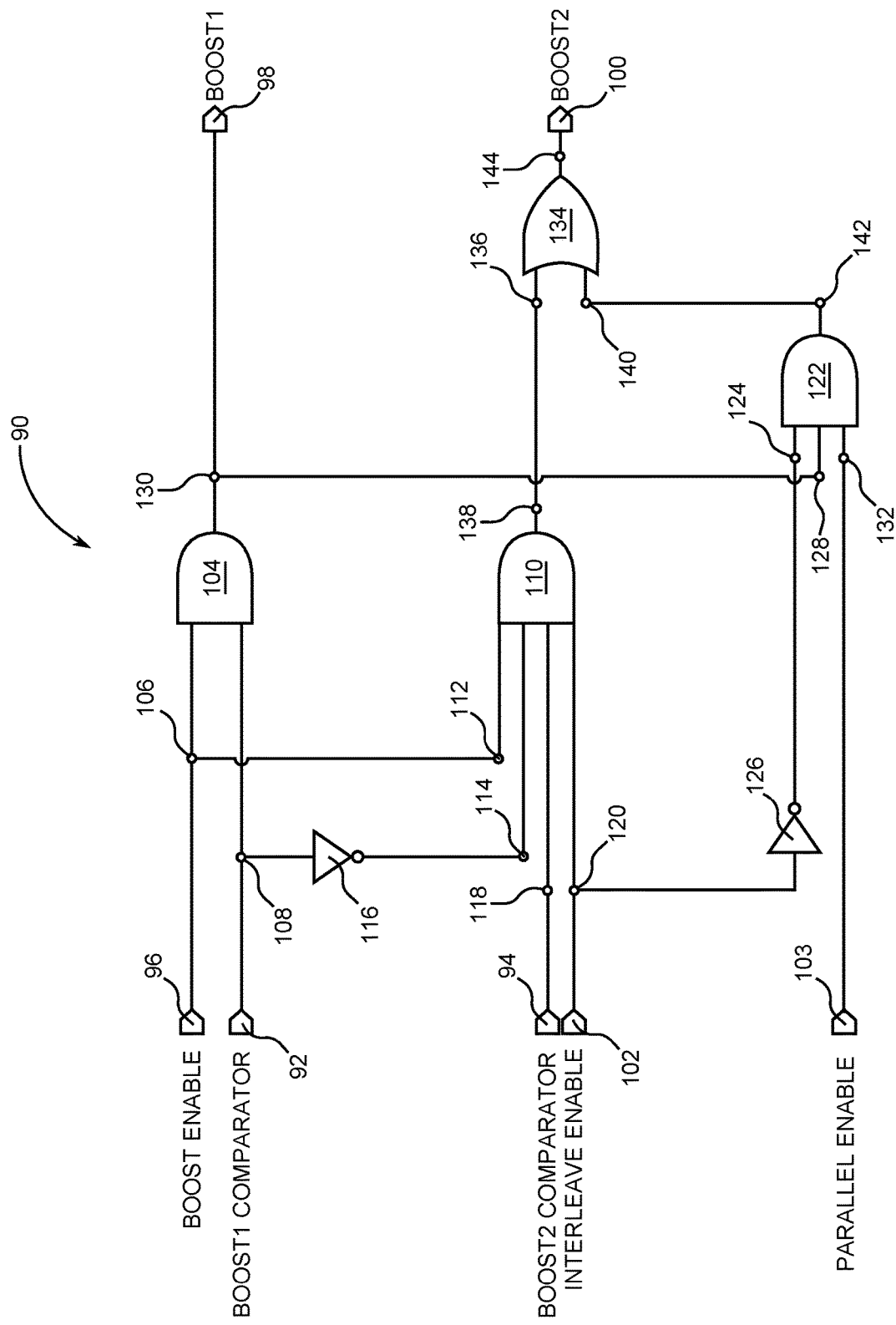
FIG. 6 is a detailed schematic of an exemplary embodiment of boost logic circuitry of the sub-controller depicted in FIG. 3.

FIG. 6 is a detailed schematic of an exemplary embodiment of boost logic circuitry 90 of the sub-controller 52 depicted in FIG. 3. The boost logic circuitry 90 includes a first AND gate 104 having a first AND input 106 coupled to the third logic input terminal 96 to receive the BOOST ENABLE signal. The first AND gate 104 further includes a second AND input 108 coupled to the first logic input terminal 92 to receive a BOOST1 COMPARATOR signal generated by the first comparator 70 (FIG. 3).

The boost logic circuitry 90 also includes a second AND gate 110 having a third AND input 112 coupled to the first AND input 106. The second AND gate 110 has a fourth AND input 114 coupled to the second AND input 108 through a first NOT gate 116. A fifth AND input 118 is coupled to the second logic input terminal 94 to receive a BOOST2 COMPARATOR signal generated by the second comparator 74 (FIG. 3). A sixth AND input 120 is coupled to the fourth logic input terminal 102 to receive the INTERLEAVE ENABLE signal. The INTERLEAVE ENABLE signal is typically used to enable the interleaved mode during relatively lower resource block envelope tracking signals that have an output modulation between 180 kHz to 10 MHz.

A third AND gate 122 has a seventh AND input 124 coupled to the sixth AND input 120 through a second NOT gate 126. An eighth AND input 128 is coupled to a first AND output 130 that in turn is coupled to the first logic output terminal 98 at which the BOOST1 signal is provided. A ninth AND input 132 is coupled to the fifth logic input terminal 103 that receives the PARALLEL ENABLE signal. The PARALLEL ENABLE signal is typically used to enable the parallel mode for any resource block tracking signal range where the interleave mode is not practical or desirable to use.

An OR gate 134 has a first OR input 136 coupled to a second AND output 138 of the second AND gate 110. The OR gate 134 has a second OR input 140 coupled to a third AND output 142 of the third AND gate 122. The OR gate 134 has an OR output 144 coupled to the second logic output terminal 100 at which the BOOST2 signal is provided. FIG. 7 is a logic table depicting various logic states for the boost logic circuitry 90 depicted in FIG. 6.

Figure 8:
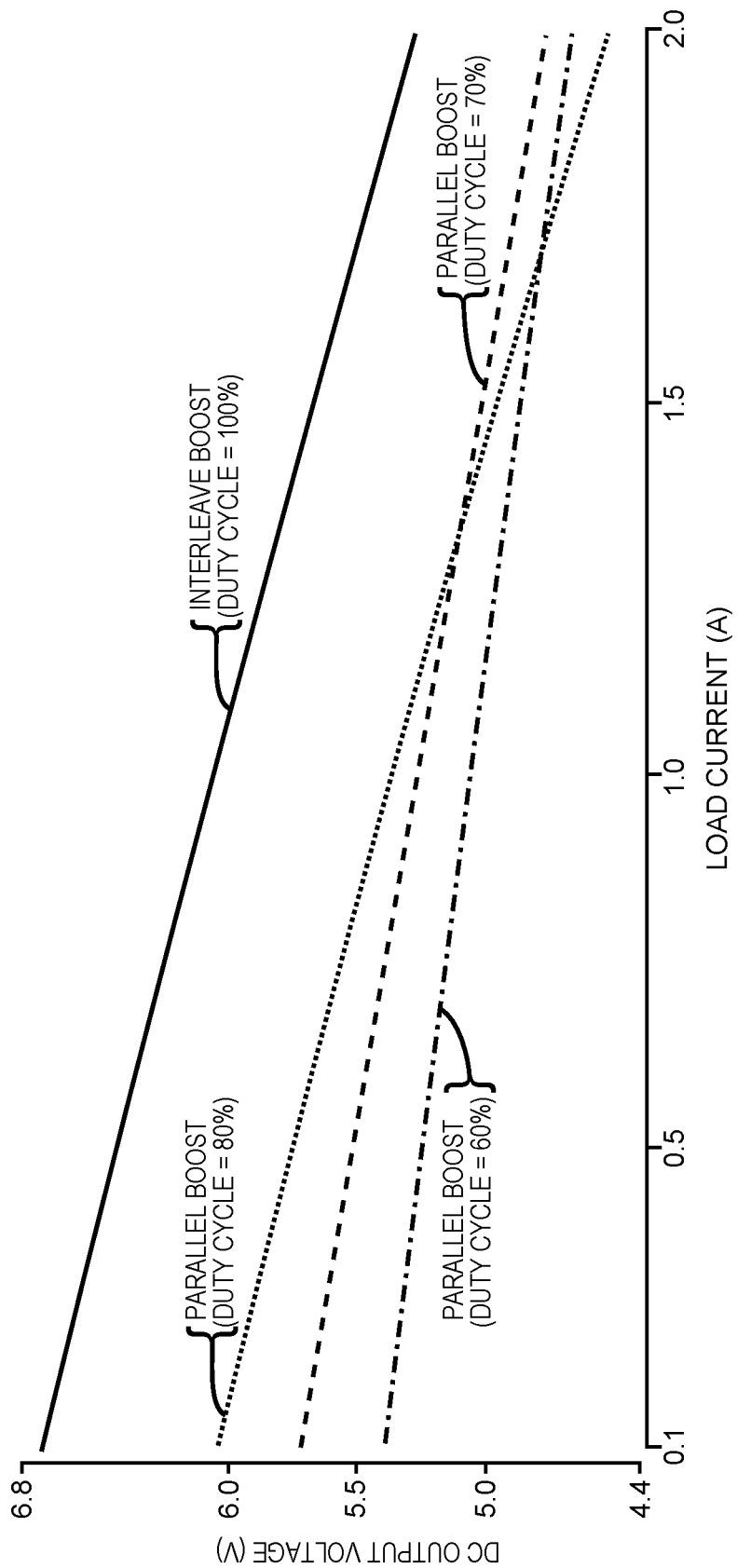
FIG. 8 is a graph of output voltage $V_{CC}$ versus direct current load current for the exemplary embodiment of FIG. 1 boosting voltage in the interleaved mode with a 100% duty cycle in comparison with lower duty cycles used with the parallel boost mode.

FIG. 8 is a graph of the modulated output supply voltage $V_{CC}$ versus direct current load current for the embodiment of FIG. 1 boosting voltage in the interleaved mode with 100% duty cycle in comparison with lower duty cycles used with the parallel boost mode. A solid line represents boosting from the voltage source battery $V_{BAT}$ in the interleaved mode at a duty cycle of 100%. A short-dashed line represents the parallel boost mode operation at an 80% duty cycle, whereas a long-dashed line represents the parallel boost mode operated at a 70% duty cycle. A dot-dashed line represents the parallel boost mode at a 60% duty cycle.

Those skilled in the art will recognize improvements and modifications to the preferred embodiments of the present disclosure. All such improvements and modifications are considered within the scope of the concepts disclosed herein and the claims that follow.

What is claimed is:
1. Charge pump tracker circuitry comprising:
a first flying capacitor;
a first switch network configured to couple the first flying capacitor to a voltage input terminal during a first charging phase and couple the first flying capacitor to a pump output terminal during a first discharging phase;
a second flying capacitor;
a second switch network configured to couple the second flying capacitor to the voltage input terminal during a second charging phase and couple the second flying capacitor to the pump output terminal during a second discharging phase; and a switch controller configured to monitor a first voltage across the first flying capacitor during the first discharging phase and monitor a second voltage across the second flying capacitor during the second discharging phase and in response control the first switch network and the second switch network so that the first discharging phase and the second discharging phase alternate in an interleaved mode, and so that the first discharging phase and the second discharging phase are in phase during a parallel boost mode.

2. The charge pump tracker circuitry of claim 1 wherein the first flying capacitor is coupled between a first flying node and a second flying node, and the first switch network comprises:

a first switch coupled between the first flying node and a voltage source terminal through which a first charging current flows into the first flying capacitor when the first switch is closed;

a second switch coupled between the first flying node and a first output terminal that receives a first discharging current from the first flying capacitor when the second switch is closed;

a third switch coupled between the second flying node and the voltage source terminal through which a voltage at the voltage source terminal is supplied to the second flying node when the third switch is closed; and a fourth switch coupled between the second flying node and a first ground node terminal that grounds the second flying node when the fourth switch is closed.

3. The charge pump tracker circuitry of claim 2 wherein the second flying capacitor is coupled between a third flying node and a fourth flying node, and the second switch network comprises:

a fifth switch coupled between the third flying node and the voltage source terminal through which a second charging current flows into the second flying capacitor when the fifth switch is closed;

a sixth switch coupled between the third flying node and the first output terminal that receives a second discharging current from the second flying capacitor when the sixth switch is closed;

a seventh switch coupled between the fourth flying node and the voltage source terminal through which the voltage at the voltage source terminal is supplied to the fourth flying node when the seventh switch is closed; and an eighth switch coupled between the fourth flying node and a second ground node terminal that grounds the fourth flying node when the eighth switch is closed.

4. The charge pump tracker circuitry of claim 3 wherein the switch controller is configured to open and close the second switch and the sixth switch in unison in the parallel boost mode and simultaneously open the second switch and close the sixth switch and vice versa in the interleaved mode.

5. The charge pump tracker circuitry of claim 1 wherein the first discharging phase and the second discharging phase provide a 100% duty cycle for the interleaved mode.

6. The charge pump tracker circuitry of claim 1 further including a power inductor coupled between the pump output terminal and a radio frequency (RF) amplifier supply terminal, wherein the power inductor is configured to filter power flowing between the pump output terminal and the RF amplifier supply terminal.

7. The charge pump tracker circuitry of claim 6 further including a RF amplifier that is configured to receive power from the RF amplifier supply terminal.

8. The charge pump tracker circuitry of claim 7 further including a tracker amplifier having:

a first amplifier input terminal coupled to the RF amplifier supply terminal to receive a feedback signal;

a second amplifier input terminal configured to receive a target voltage waveform; and an amplifier output terminal communicatively coupled to the pump output terminal, wherein the tracker amplifier is configured to provide an amplified output waveform in response to a difference between the target voltage waveform and the feedback signal.

9. The charge pump tracker circuitry of claim 8 wherein the target voltage waveform is an envelope tracking signal.

10. The charge pump tracker circuitry of claim 8 wherein the target voltage waveform is an average power tracking signal.

11. The charge pump tracker circuitry of claim 8 further including an offset capacitor coupled between the amplifier output terminal and the RF amplifier supply terminal, wherein the offset capacitor is configured to provide an offset voltage to increase dynamic range of the amplified output waveform in order to reduce a maximum voltage needed to supply the tracker amplifier.

12. The charge pump tracker circuitry of claim 1 wherein the switch controller further includes a sub-controller that is configured to monitor the first voltage across the first flying capacitor and compare the first voltage with a threshold voltage and in response generate a first logic output signal.

13. The charge pump tracker circuitry of claim 12 wherein the sub-controller is further configured to monitor the second voltage across the second flying capacitor and compare the second voltage with the threshold voltage and in response generate a second logic output signal.

14. The charge pump tracker circuitry of claim 13 wherein the sub-controller further includes boost logic circuitry that is configured to receive the first logic output signal and generate a first boost signal that drives the switch controller to couple the first flying capacitor between the first charging phase and the first discharging phase.

15. The charge pump tracker circuitry of claim 14 wherein the boost logic circuitry is further configured to generate a second boost signal that drives the switch controller to couple the second flying capacitor between the second charging phase and the second discharging phase.

16. The charge pump tracker circuitry of claim 15 wherein the boost logic circuitry is configured to receive a boost enable signal that enables generation of the first boost signal and the second boost signal when the boost enable signal is in a logic true state and disables generation of the first boost signal and the second boost signal when the boost enable signal is in a logic false state.

17. The charge pump tracker circuitry of claim 15 wherein the boost logic circuitry is configured to receive an interleave enable signal that enables the interleaved mode when the interleave enable signal is in a logic true state and disables the interleaved mode and enables the parallel boost mode when the interleave enable signal is in a logic false state.

18. The charge pump tracker circuitry of claim 15 wherein frequency of the first boost signal and the second boost signal is between 500 kHz to 10 MHz.

19. The charge pump tracker circuitry of claim 15 wherein frequency of the first boost signal and the second boost signal is between 10 MHz to 20 MHz.

20. The charge pump tracker circuitry of claim 1 wherein the interleaved mode is enabled for envelope tracking signals having an envelope modulation frequency that is between 180 kHz to 10 MHz.

* * * * *